(12) United States Patent
Morifuji et al.

(10) Patent No.: US 9,053,991 B2
(45) Date of Patent: Jun. 9, 2015

(54) SEMICONDUCTOR DEVICE

(71) Applicant: Rohm Co., Ltd., Kyoto (JP)

(72) Inventors: Tadahiro Morifuji, Kyoto (JP);
Shigeyuki Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/337,959

(22) Filed: Jul. 22, 2014

(65) Prior Publication Data

US 2014/0332954 A1 Nov. 13, 2014

Related U.S. Application Data

(60) Continuation of application No. 13/856,905, filed on Apr. 4, 2013, now Pat. No. 8,922,010, which is a division of application No. 12/663,563, filed as application No. PCT/JP2008/060844 on Jun. 13, 2008, now Pat. No. 8,436,467.

(30) Foreign Application Priority Data

Jun. 15, 2007 (JP) ................................. 2007-159351
Jun. 15, 2007 (JP) ................................. 2007-159354

(51) Int. Cl.
*H01L 23/48* (2006.01)
*H01L 23/00* (2006.01)
*H01L 23/31* (2006.01)

(52) U.S. Cl.
CPC ............ *H01L 24/13* (2013.01); *H01L 23/3128* (2013.01); *H01L 23/3171* (2013.01); *H01L 23/3192* (2013.01); *H01L 24/03* (2013.01);
(Continued)

(58) Field of Classification Search
CPC ............ H01L 21/3065; H01L 51/5012; H01L 21/0332; H01L 2933/0041; H01L 31/18
USPC .......... 257/737, 738, 780, E21.508, E23.021, 257/E23.069
See application file for complete search history.

(56) References Cited

U.S. PATENT DOCUMENTS 6,452,270 B1 9/2002 Huang
6,522,016 B1 2/2003 Makino et al.
(Continued)

FOREIGN PATENT DOCUMENTS

JP 57-73936 10/1980
JP 073936/1982 5/1982
(Continued)

OTHER PUBLICATIONS

USPTO, official communication in U.S. Appl. No. 14/491,556 (Nov. 6, 2014).

*Primary Examiner* — Andy Huynh
(74) *Attorney, Agent, or Firm* — Fish & Richardson P.C.

(57) ABSTRACT

Disclosed is a semiconductor device suppressed in decrease of reliability. The semiconductor device comprises an electrode pad portion (2) formed on the upper surface of a semiconductor substrate (1), a passivation layer (3) so formed on the upper surface of the semiconductor substrate (1) as to overlap a part of the electrode pad portion (2) and having a first opening portion (3a) where the upper surface of the electrode pad portion (2) is exposed, a barrier metal layer (5) formed on the electrode pad portion (2), and a solder bump (6) formed on the barrier metal layer (5). The barrier metal layer (5) is formed such that an outer peripheral end (5b) lies within the first opening portion (3a) of the passivation layer (3) when viewed in plan.

23 Claims, 14 Drawing Sheets

(52) U.S. Cl.
CPC .............. *H01L 24/05* (2013.01); *H01L 24/11* (2013.01); *H01L 24/12* (2013.01); *H01L 24/81* (2013.01); *H01L 2224/03912* (2013.01); *H01L 2224/03914* (2013.01); *H01L 2224/0401* (2013.01); *H01L 2224/1147* (2013.01); *H01L 2224/13006* (2013.01); *H01L 2224/13023* (2013.01); *H01L 2224/13099* (2013.01); *H01L 2224/16* (2013.01); *H01L 2224/8121* (2013.01); *H01L 2224/81815* (2013.01); *H01L 2924/01004* (2013.01); *H01L 2924/01013* (2013.01); *H01L 2924/01014* (2013.01); *H01L 2924/01015* (2013.01); *H01L 2924/01022* (2013.01); *H01L 2924/01029* (2013.01); *H01L 2924/01033* (2013.01); *H01L 2924/0105* (2013.01); *H01L 2924/01073* (2013.01); *H01L 2924/01078* (2013.01); *H01L 2924/01079* (2013.01); *H01L 2924/01082* (2013.01); *H01L 2924/014* (2013.01); *H01L 2924/05042* (2013.01); *H01L 2924/15311* (2013.01); *H01L 2224/05541* (2013.01); *H01L 2924/01006* (2013.01); *H01L 2224/05027* (2013.01); *H01L 2224/05014* (2013.01); *H01L 2224/05557* (2013.01); *H01L 2224/05555* (2013.01); *H01L 2224/11902* (2013.01); *H01L 2224/05583* (2013.01); *H01L 2224/0569* (2013.01)

(56) References Cited

U.S. PATENT DOCUMENTS

| | | | |
|---|---|---|---|
| 6,545,355 | B2 | 4/2003 | Yanagida |
| 6,737,353 | B2 | 5/2004 | Fang et al. |
| 8,436,467 | B2 | 5/2013 | Morifuji et al. |
| 8,922,010 | B2 | 12/2014 | Morifuji et al. |
| 2004/0075164 | A1 | 4/2004 | Pu et al. |
| 2005/0199989 | A1 | 9/2005 | Aoki et al. |
| 2006/0038291 | A1 | 2/2006 | Chung et al. |
| 2007/0001317 | A1 | 1/2007 | Matsuoka et al. |
| 2015/0021765 | A1 | 1/2015 | Morifuji et al. |

FOREIGN PATENT DOCUMENTS

| | | |
|---|---|---|
| JP | 01-187949 | 7/1989 |
| JP | 9-129647 | 5/1997 |
| JP | 2001-15539 | 1/2001 |
| JP | 2001-035876 | 2/2001 |
| JP | 2005-259848 | 9/2005 |
| JP | 2006-019550 | 1/2006 |
| JP | 2007-013063 | 1/2007 |

SEMICONDUCTOR DEVICE

TECHNICAL FIELD

The present invention relates to a semiconductor device in which a semiconductor chip is bonded by on a flip chip basis.

BACKGROUND ART

There are conventionally known semiconductor packages (semiconductor devices) in which a semiconductor chip is bonded by flip chip bonding. A semiconductor chip to be mounted in such a semiconductor package has solder bumps (bump electrodes) formed on it to allow flip chip bonding (for example, see Patent Document 1 listed below).

FIGS. 29 to 31 are schematic sectional views showing the structure of a conventional semiconductor device disclosed in Patent Document 1. In the conventional semiconductor device, as shown in FIG. 29, an electrode pad portion 1002 is formed on the top face of a semiconductor substrate 1001. It should be understood that on the top face of the semiconductor substrate 1001, a circuit (unillustrated) such as an IC or LSI has been fabricated. Moreover, on the top face of the semiconductor substrate, a protection layer 1003 for protecting the top face of the semiconductor substrate 1001 is formed. The protection layer 1003 has an opening 1003a through which a predetermined region on the electrode pad portion 1002 is exposed. Moreover, the protection layer 1003 is so formed as to overlap a peripheral part of the electrode pad portion 1002, with the result that the protection layer 1003 has a step part 1003b formed in it.

Moreover on the electrode pad portion 1002, via a barrier metal layer 1004, a bump electrode 1005 is formed. The barrier metal layer 1004 is formed on the electrode pad portion 1002 such that a peripheral part 1004a of the barrier metal layer 1004 rests on a region of the protection layer 1003 overlapping the electrode pad portion 1002. That is, a circumferential end part 1004b of the barrier metal layer 1004 is formed on the region of the protection layer 1003 overlapping the electrode pad portion 1002.

Moreover, as shown in FIG. 30, the semiconductor substrate 1001 having the bump electrode 1005 formed on it is arranged face down above a printed circuit board 1006—in such a way that the top face (circuit face) of the semiconductor substrate 1001 faces the printed circuit board 1006—, and is connected by the bump electrode 1005 to an electrode 1007 on the printed circuit board 1006 on a flip chip basis.

Patent Document 1: JP-A-2007-13063

DISCLOSURE OF THE INVENTION

Problems to be Solved by the Invention

In the conventional semiconductor device disclosed in Patent Document 1 mentioned above, since the barrier metal layer 1004 is so configured that its peripheral part 1004a rests on the part of the protection layer 1003 overlapping the electrode pad portion 1002, disadvantageously, as shown in FIGS. 30 and 31, when a thermal stress ascribable to a difference in thermal expansion coefficient between the semiconductor substrate 1001 and the printed circuit board 1006 acts on the bump electrode 1005, a crack is prone to develop in a region of the protection layer 1003 under (a region thereof corresponding to) the circumferential end part 1004b of the barrier metal layer 1004. This makes the protection layer 1003 prone to breakage, leading to the inconvenience that when the protection layer 1003 breaks, the breakage lowers the reliability of the semiconductor device.

The present invention has been made to solve problems as discussed above, and an object of the invention is to provide a semiconductor device that can suppress a lowering in reliability.

Means for Solving the Problem

To achieve the above object, according to a first aspect of the invention, a semiconductor device is provided with: an electrode pad portion formed on a face of a substrate; a first protection layer including a first opening through which a top face of the electrode pad portion is exposed, the first protection layer being formed on the face of the substrate to overlap part of the electrode pad portion; a barrier metal layer formed on the electrode pad portion; and a bump electrode formed on the barrier metal layer. Here, the barrier metal layer has a circumferential end part thereof formed inward of the first opening in the first protection layer as seen in a plan view.

In this semiconductor device according to the first aspect, as described above, the barrier metal layer is so configured that its circumferential end part is formed inward of the first opening in the first protection layer as seen in a plan view, and consequently no first protection layer is formed under the circumferential end part of the barrier metal layer. Thus, during the flip chip bonding of the substrate onto the printed circuit board, even when a thermal stress ascribable to a difference in thermal expansion coefficient between the substrate and the printed circuit board acts on the bump electrode, it is possible to suppress development of a crack in the first protection layer. Thus, it is possible to suppress breakage of the first protection layer, and it is thereby possible to suppress a lowering in the reliability of the semiconductor device resulting from breakage of the first protection layer.

In the above-described semiconductor device according to the first aspect, preferably, there is additionally provided: a second protection layer formed to cover a predetermined region on the first protection layer and a predetermined region on the electrode pad portion. Here, the barrier metal layer is formed on the electrode pad portion with a peripheral part of the barrier metal layer located over the second protection layer. With this configuration, it is possible to form easily the barrier metal layer such that its circumferential end part is located inward of the first opening in the first protection layer as seen in a plan view.

In this case, preferably, in the second protection layer, a second opening is formed through which the top face of the electrode pad portion is exposed and that has an opening width smaller than the first opening, and a rim part of the second protection layer defining the second opening has an inclined shape. With this configuration, even when the peripheral part of the barrier metal layer is formed over the second protection layer, it is possible to suppress breakage of the barrier metal layer. Thus, it is possible to suppress a lowering in the reliability of the semiconductor device resulting from breakage of the first protection layer, and in addition it is possible to suppress a lowering in the reliability of the semiconductor device resulting from breakage of the barrier metal layer. It is thus possible to suppress more easily a lowering in the reliability of the semiconductor device.

In the above-described configuration in which the second protection layer is formed, preferably, the second protection layer is formed of polyimide. With this configuration, it is possible to suppress breakage of the first protection layer more easily.

In the above-described semiconductor device according to the first aspect, the electrode pad portion may be formed of a material containing aluminum, the barrier metal layer may be formed of a material containing titanium, and the bump electrode may comprise a solder bump.

According to a second aspect of the invention, a semiconductor device is provided with: an electrode pad portion formed on a face of a substrate; a first protection layer including a first opening through which a top face of the electrode pad portion is exposed, the first protection layer being formed on the face of the substrate to overlap part of the electrode pad portion; a barrier metal layer formed on the electrode pad portion so as not to make direct contact with the first protection layer; and a bump electrode formed on the barrier metal layer. Here, the first protection layer has a step part formed in it as a result of the first protection layer overlapping the part of the electrode pad portion, and the barrier metal layer has a circumferential end part thereof formed outward of the step part as seen in a plan view.

In this semiconductor device according to the second aspect, as described above, the barrier metal layer is formed on the electrode pad portion so as not to make direct contact with first protection layer. Thus, during the flip chip bonding of the substrate onto the printed circuit board, even when a thermal stress ascribable to a difference in thermal expansion coefficient between the substrate and the printed circuit board acts on the solder bump, it is possible to suppress the thermal stress acting on the first protection layer, and thus it is possible to suppress development of a crack in the first protection layer. Thus, it is possible to suppress breakage of the first protection layer, and it is thereby possible to suppress a lowering in the reliability of the semiconductor device resulting from breakage of the first protection layer.

Moreover, according to the second aspect, the barrier metal layer is so configured that its circumferential end part is formed outward of the step part as seen in a plan view, and this permits the barrier metal layer to be configured such that the step part is not located right under the circumferential end part. Here, in the step part of the first protection layer, because the first protection layer is partly less thick and for other reasons, a crack is more likely to develop than in the other part of the first protection layer; on the other hand, however, thanks to the configuration described above, even when a thermal stress ascribable to a difference in thermal expansion coefficient between the substrate and the printed circuit board acts on the solder bump, it is possible to suppress development of a crack in the step part of the first protection layer. This, too, contributes to suppressing a lowering in the reliability of the semiconductor device resulting from breakage of the first protection layer.

In this case, preferably, there is additionally provided: a second protection layer formed to cover a predetermined region on the first protection layer and a predetermined region on the electrode pad portion. Here, the barrier metal layer is formed on the electrode pad portion with a peripheral part of the barrier metal layer located over the second protection layer. With this configuration, when the barrier metal layer is formed on the electrode pad portion, it is possible to form easily the barrier metal layer such that it does not make direct contact with the first protection layer and that its circumferential end part is located outward of the step part as seen in a plan view.

In this case, preferably, in the second protection layer, a second opening is formed through which the top face of the electrode pad portion is exposed and that has an opening width smaller than the first opening, and a rim part of the second protection layer defining the second opening has an inclined shape. With this configuration, even when the peripheral part of the barrier metal layer is formed over the second protection layer, it is possible to suppress breakage of the barrier metal layer. Thus, it is possible to suppress a lowering in the reliability of the semiconductor device resulting from breakage of the first protection layer, and in addition it is possible to suppress a lowering in the reliability of the semiconductor device resulting from breakage of the barrier metal layer. It is thus possible to suppress more easily a lowering in the reliability of the semiconductor device.

In the above-described configuration in which the second protection layer is formed, preferably, the second protection layer is formed of polyimide. With this configuration, it is possible to suppress breakage of the first protection layer more easily.

In the above-described semiconductor device according to the second aspect, the electrode pad portion may be formed of a material containing aluminum, the barrier metal layer may be formed of a material containing titanium, and the bump electrode may comprise a solder bump.

Advantages of the Invention

As described above, according to the present invention, it is possible to obtain easily a semiconductor device that can suppress a lowering in reliability.

Figure 1:
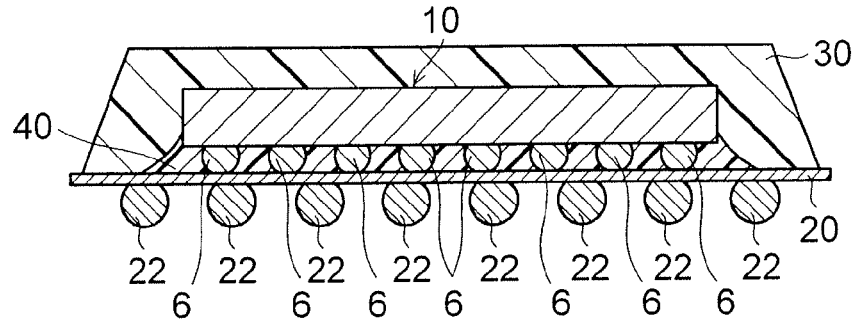
FIG. 1 A sectional view showing the structure of a semiconductor device according to a first embodiment of the invention.

LIST OF REFERENCE SYMBOLS 1, 401 semiconductor substrate (substrate)
2, 402 electrode pad portion
3, 403 passivation layer (first protection layer)
3a, 403a first opening
3b, 403b step part
4, 404 insulating protection layer (second protection layer)
4a, 404a second opening
4b, 404b rim part
5, 405 barrier metal layer
5a, 405a peripheral part
5b, 405b circumferential end part
6, 406 solder bump (bump electrode)
10, 110, 210,
310, 410, 510 semiconductor chip
20, 420 printed circuit board
21, 421 connection pad portion
22, 422 electrode terminal
30, 430 resin sealing layer
40, 440 resin member

BEST MODE FOR CARRYING OUT THE INVENTION

Hereinafter, as specific examples of how the present invention is carried out, embodiments of the invention will be described with reference to the accompanying drawings. The embodiments presented below deal with examples in which the invention is applied to a semiconductor device with a BGA (ball grid array) package in which a semiconductor chip is bonded by flip chip bonding.

First Embodiment

Figure 2:
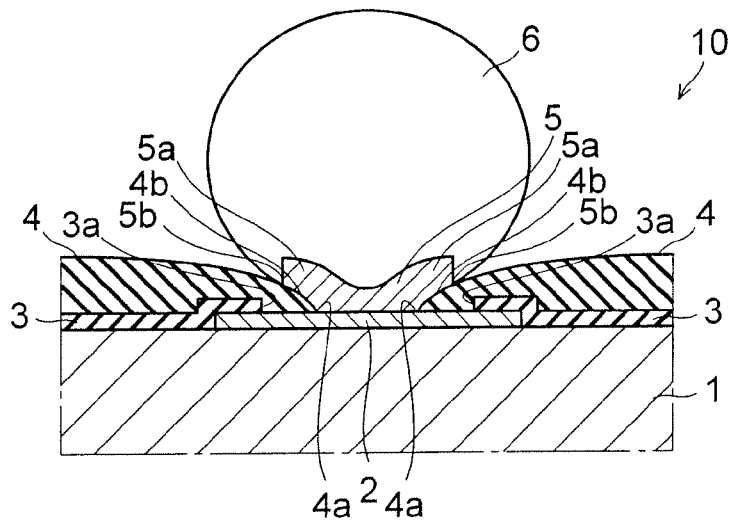
FIG. 2 A sectional view showing the structure of an electrode portion of the semiconductor chip in the semiconductor device shown in FIG. 1 according to the first embodiment of the invention.
Figure 3:
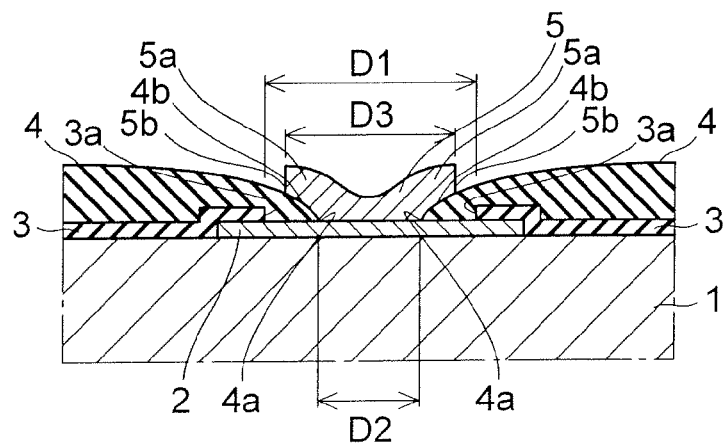
FIG. 3 A sectional view showing the structure of an electrode portion of the semiconductor chip, with a solder bump omitted, in the semiconductor device shown in FIG. 1 according to the first embodiment of the invention.
Figure 4:
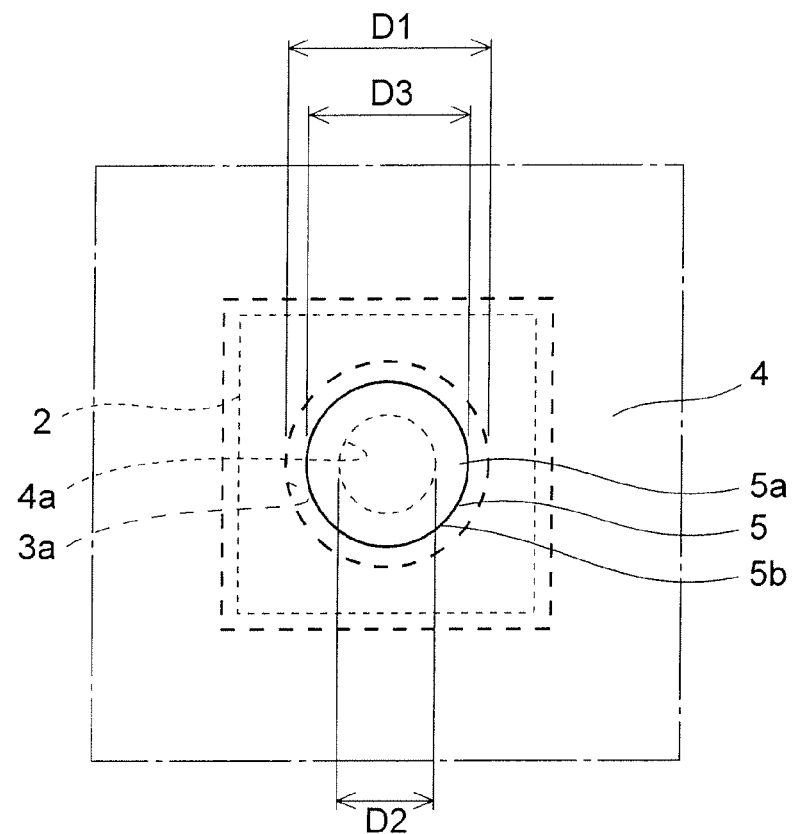
FIG. 4 A plan view showing the structure of an electrode portion of the semiconductor chip, with the solder bump omitted, in the semiconductor device shown in FIG. 1 according to the first embodiment of the invention.
Figure 5:
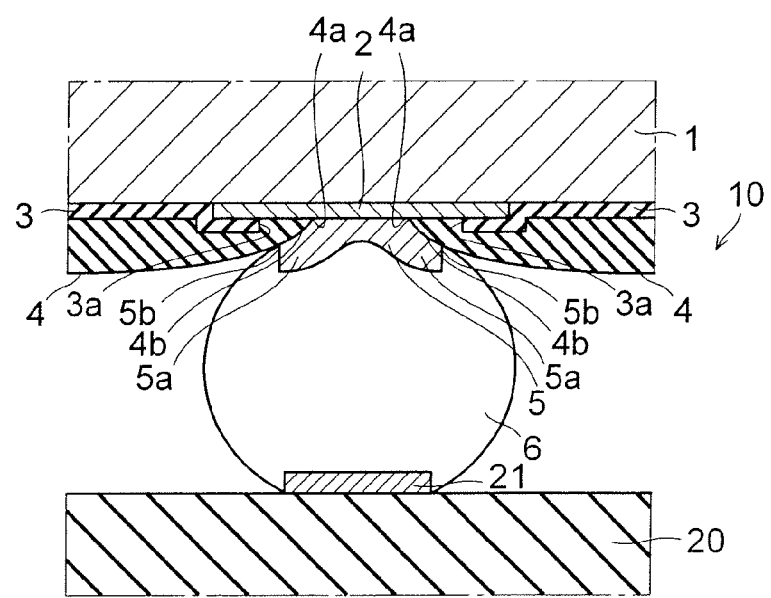
FIG. 5 A sectional view showing the semiconductor chip mounted on a printed circuit board.

FIG. 1 is a sectional view showing the structure of a semiconductor device according to a first embodiment of the invention. FIG. 2 is a sectional view showing the structure of an electrode portion of a semiconductor chip in the semiconductor device shown in FIG. 1 according to the first embodiment of the invention. FIGS. 3 to 5 are diagrams illustrating the structure of the semiconductor device according to the first embodiment of the invention. First, with reference to FIGS. 1 to 5, the structure of the semiconductor device according to the first embodiment of the invention will be described.

As shown in FIG. 1, the semiconductor device according to the first embodiment is provided with a semiconductor chip 10, a printed circuit board 20 on which the semiconductor chip 10 is mounted, and a resin sealing layer 30 that seals the semiconductor chip 10 in. The resin sealing layer 30 is formed of a thermosetting resin such as epoxy resin.

The semiconductor chip 10 comprises a semiconductor substrate 1 such as a silicon substrate, and on the top face of the semiconductor substrate 1, a circuit (unillustrated) such as an IC or LSI has been fabricated. It should be understood that the semiconductor substrate 1 is an example of a "substrate" according to the invention.

Moreover, as shown in FIGS. 2 and 3, on the top face of the semiconductor substrate 1, an electrode pad portion 2 of aluminum or an alloy of aluminum is formed. Moreover, on the top face of the semiconductor substrate 1, a passivation layer 3 of silicon nitride is formed. In the passivation layer 3, a first opening 3a is formed through which a predetermined region of the electrode pad portion 2 is exposed. As shown in FIG. 4, the first opening 3a has a substantially circular shape as seen in a plan view, and is formed with an opening width D1 of about 85 μm to about 95 μm. Moreover, the passivation layer 3 is formed on the top face of the semiconductor substrate 1 so as to overlap a peripheral part of the electrode pad portion 2. It should be understood that the passivation layer 3 is an example of a "first protection layer" according to the invention.

Moreover, over a predetermined region on the passivation layer 3 and a predetermined region on the electrode pad portion 2, an insulating protection layer 4 of polyimide is formed. As shown in FIGS. 3 and 4, in the insulating protection layer 4, a second opening 4a is provided that has an opening width D2 (about 55 μm to about 65 μm) smaller than the opening width D1 (about 85 μm to about 95 μm) of the first opening 3a in the passivation layer 3. As shown in FIG. 4, the second opening 4a has a substantially circular shape as seen in a plan view, and is formed to be substantially concentric with the first opening 3a. Moreover, a rim part 4b of the insulating protection layer 4 defining the second opening 4a is formed in an inclined shape. It should be understood that the insulating protection layer 4 is an example of a "second protection layer" according to the invention.

Moreover, as shown in FIGS. 2 and 3, on the electrode pad portion 2, a barrier metal layer 5 with a thickness of about 10 μm and of titanium (Ti) is formed, with a peripheral part 5a of the barrier metal layer 5 located in a region on the insulating protection layer 4 near the rim part 4b. As shown in FIG. 4, the barrier metal layer 5 has a substantially circular shape as seen in a plan view, and is formed to be substantially concentric with the first opening 3a and with the second opening 4a.

Here, in the first embodiment, the barrier metal layer 5 is so formed that a circumferential end part 5b of the barrier metal layer 5 is located inward of the first opening 3a in the passivation layer 3 as seen in a plan view. That is, as shown in FIG. 3 or 4, the barrier metal layer 5 is configured with a width D3 (about 70 μm to about 80 μm) smaller than the width D1 of the first opening 3a in the passivation layer 3.

Moreover, as shown in FIG. 2, on the barrier metal layer 5, a solder bump 6 with a height (thickness) of about 70 μm to about 100 μm and of a spherical shape is formed. The solder bump 6 is electrically connected, via the barrier metal layer 5, to the electrode pad portion 2. Moreover, the solder bump 6 is formed on the barrier metal layer 5 such that the solder bump 6 makes contact not only with the top face of the barrier metal layer 5 but also with the circumferential end part 5b of the barrier metal layer 5. That is, the solder bump 6 is bonded to the barrier metal layer 5 so as to cover the circumferential end part 5b of the barrier metal layer 5. This results in a larger bonding area than in a case where the solder bump 6 is bonded only to the top face, and thus contributes to increased bonding strength between the solder bump 6 and the barrier metal layer 5. It should be understood that the solder bump 6 is an example of a "bump electrode" according to the invention.

The printed circuit board 20 shown in FIG. 1 is formed of glass epoxy resin or the like, and has conductor layers (unillustrated) in a multiple-layer structure. On the top face of the printed circuit board 20, a plurality of connection pad portions 21 (see FIG. 5) are formed for electrical connection with solder bumps 6 on the semiconductor chip 10. On the bottom face of the printed circuit board 20, a plurality of electrode terminals 22 are formed that are electrically connected to the connection pad portions 21. The electrode terminals 22 are solder bumps 6 of a spherical shape, and are arrayed in a lattice-like pattern on the bottom face of the printed circuit board 20.

As shown in FIGS. 1 and 5, the semiconductor chip 10 having the solder bumps 6 formed on it is mounted face down on the printed circuit board 20. Specifically, as shown in FIG. 5, the semiconductor chip 10 is arranged with its top face (circuit face) facing the printed circuit board 20, and the solder bumps 6 on the semiconductor chip 10 are bonded to the connection pad portions 21 on the printed circuit board 20 by flip chip bonding. This electrically connects the solder bumps 6 and the connection pad portions 21 together.

As shown in FIG. 1, the gap between the semiconductor chip 10 and the printed circuit board 20 is filled with a resin member 40 of silicone resin, epoxy resin, acrylic resin, or the like.

In the first embodiment, as described above, the barrier metal layer 5 is so configured that its circumferential end part 5b is formed inward of the first opening 3a in the passivation layer 3 as seen in a plan view, and consequently no passivation layer 3 is formed under the circumferential end part 5b of the barrier metal layer 5. Thus, during the flip chip bonding of the semiconductor chip 10 (semiconductor substrate 1) onto the printed circuit board 20, even when a thermal stress ascribable to a difference in thermal expansion coefficient between the semiconductor chip 10 and the printed circuit board 20 acts on the solder bump 6, it is possible to suppress development of a crack in the passivation layer 3. Thus, it is possible to suppress breakage of the passivation layer 3, and it is thereby possible to suppress a lowering in the reliability of the semiconductor device resulting from breakage of the passivation layer 3.

Under the circumferential end part 5b of the barrier metal layer 5, the insulating protection layer 4 is formed. Since the insulating protection layer 4 is formed of polyimide, which is softer than silicon nitride, of which the passivation layer 3 is formed, even when the peripheral part 5a of the barrier metal layer 5 is formed over the insulating protection layer 4, it is possible to suppress breakage of the insulating protection layer 4.

Moreover, in the first embodiment, the insulating protection layer 4 is formed over a predetermined region on the passivation layer 3 and a predetermined region on the electrode pad portion 2, and the barrier metal layer 5 is formed on the electrode pad portion 2 with the peripheral part 5a located over the insulating protection layer 4. Consequently, in the process, described later, of forming an electrode portion, it is possible to form easily the barrier metal layer 5 such that its circumferential end part 5b is located inward of the first opening 3a in the passivation layer 3 as seen in a plan view.

Moreover, in the first embodiment, the rim part 4b of the insulating protection layer 4 defining the second opening 4a is formed in an inclined shape, and consequently even when the peripheral part 5a of the barrier metal layer 5 is formed over the insulating protection layer 4, it is possible to make the barrier metal layer 5 unlikely to break. Thus, it is possible to suppress a lowering in the reliability of the semiconductor device resulting from breakage of the passivation layer 3, and in addition it is possible to suppress a lowering in the reliability of the semiconductor device resulting from breakage of the barrier metal layer 5. It is thus possible to suppress more easily a lowering in the reliability of the semiconductor device.

FIGS. 6 to 12 are sectional views illustrating the process of forming an electrode portion of the semiconductor chip in the semiconductor device according to the first embodiment. Next, with reference to FIGS. 1 to 4 and 6 to 12, the process of forming an electrode portion of the semiconductor chip 10 will be described.

Figure 6:
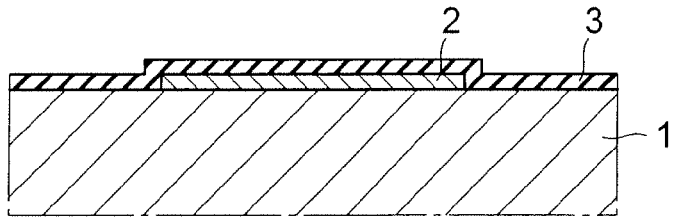
FIG. 6 A sectional view illustrating the process for forming an electrode portion of the semiconductor chip in the semiconductor device according to the first embodiment of the invention.
Figure 7:
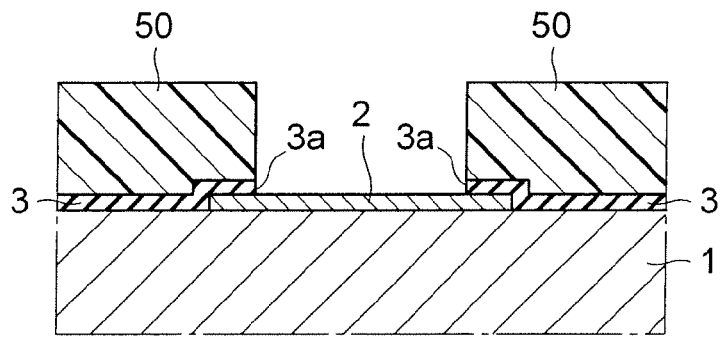
FIG. 7 A sectional view illustrating the process for forming an electrode portion of the semiconductor chip in the semiconductor device according to the first embodiment of the invention.

First, as shown in FIG. 6, over the entire surface of the top face of a semiconductor substrate 1 having an electrode pad portion 2 formed on it, a passivation layer 3 of silicon nitride is formed by plasma CVD or the like. Next, as shown in FIG. 7, a resist 50 is formed in a predetermined region on the passivation layer 3 by photolithography or the like. Then, with the resist 50 used as a mask, a predetermined region of the passivation layer 3 is removed by etching. This forms a first opening 3a in the passivation layer 3 through which a predetermined region on the electrode pad portion 2 is exposed. Here, the first opening 3a is formed with an opening width D1 (about 85 μm to about 95 μm, see FIGS. 3 and 4). The resist 50 is then removed.

Figure 8:
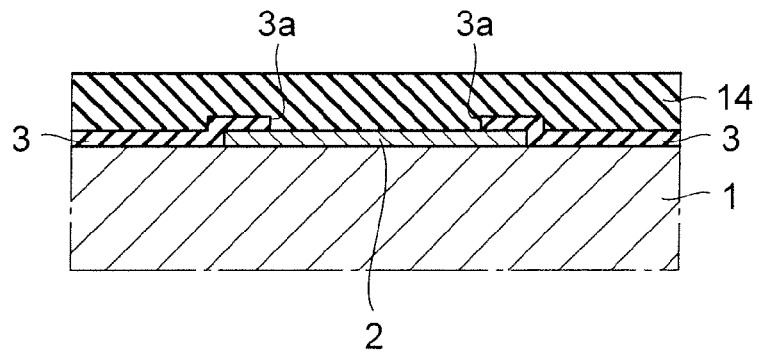
FIG. 8 A sectional view illustrating the process for forming an electrode portion of the semiconductor chip in the semiconductor device according to the first embodiment of the invention.
Figure 9:
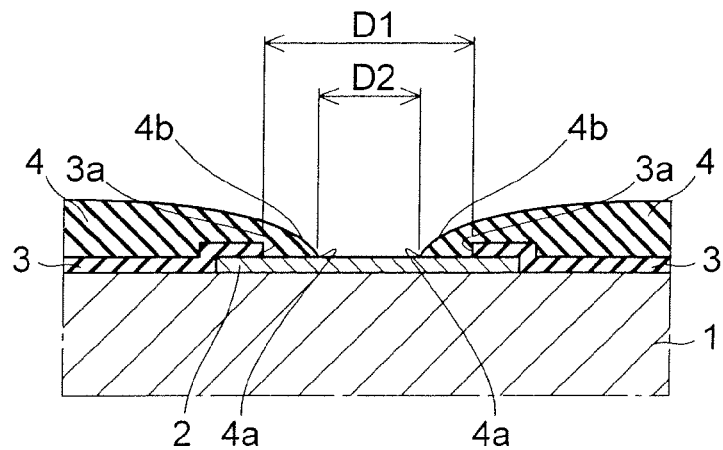
FIG. 9 A sectional view illustrating the process for forming an electrode portion of the semiconductor chip in the semiconductor device according to the first embodiment of the invention.

Subsequently, as shown in FIG. 8, over the entire surface, an insulating protection layer 14 of polyimide is formed by spin coating or the like. Then, a predetermined region of the insulating protection layer 14 is removed by photolithography and etching. Thereafter, the insulating protection layer 14 is flowed by heat processing. Thus, an insulating protection layer 4 as shown in FIG. 9 is obtained. Specifically, in the insulating protection layer 14 (see FIG. 8), a second opening 4a with an opening width D2 (about 55 μm to about 65 μm) smaller than the opening width D1 (about 85 μm to about 95 μm) of the first opening 3a in the passivation layer 3 is formed, and a rim part 4b defining the second opening 4a is formed in an inclined shape.

Figure 10:
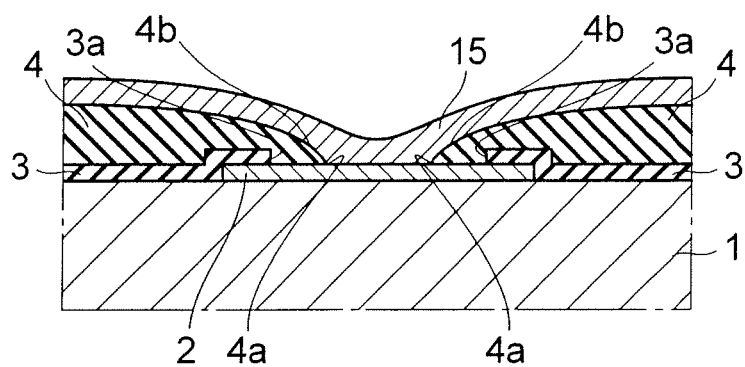
FIG. 10 A sectional view illustrating the process for forming an electrode portion of the semiconductor chip in the semiconductor device according to the first embodiment of the invention.
Figure 11:
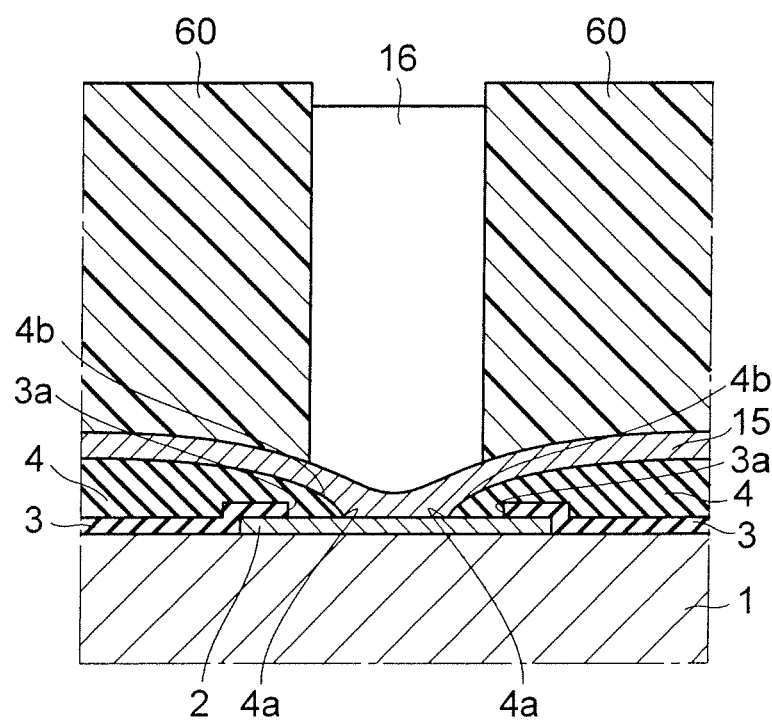
FIG. 11 A sectional view illustrating the process for forming an electrode portion of the semiconductor chip in the semiconductor device according to the first embodiment of the invention.

Next, as shown in FIG. 10, over the entire surface, a barrier metal layer 15 with a thickness of about 10 μm and of titanium (Ti) is formed by vapor deposition or the like. Next, as shown in FIG. 11, a resist 60 is formed in a predetermined region on the barrier metal layer 15 by photolithography and etching. Here, the resist 60 is so patterned that it has an opening in a region corresponding to the inside of the first opening 3a in the passivation layer 3. Then, with the resist 60 used as a mask, a solder layer 16 is formed on the barrier metal layer 15 by plating or the like.

Figure 12:
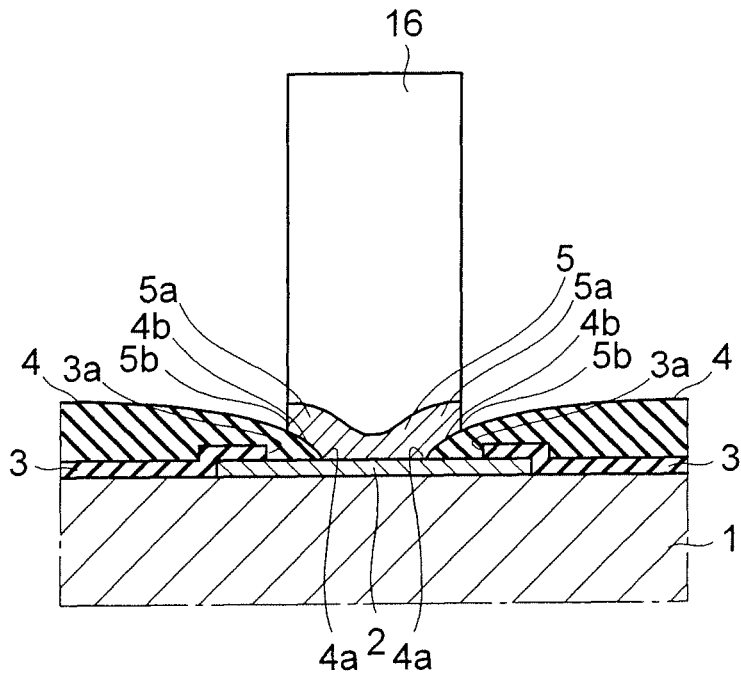
FIG. 12 A sectional view illustrating the process for forming an electrode portion of the semiconductor chip in the semiconductor device according to the first embodiment of the invention.

Thereafter, as shown in FIG. 12, the resist 60 (see FIG. 11) is removed, and the barrier metal layer 15 around the solder layer 16 is removed by etching. Thus, a barrier metal layer 5 of which a circumferential end part 5b is formed inward of the first opening 3a in the passivation layer 3 as seen in a plan view as shown in FIG. 4 is formed on the electrode pad portion 2. Moreover, as shown in FIGS. 2 and 3, the barrier metal layer 5 formed on the electrode pad portion 2 is so configured that its peripheral part 5a is located over the insulating protection layer 4.

It should be noted that, as shown in FIG. 12, forming the insulating protection layer 4 described above makes it possible to obtain a configuration in which the top face of the electrode pad portion 2 is not exposed. Thus, even when the barrier metal layer 15 is so etched that the circumferential end part 5b is formed inward of the first opening 3a in the passivation layer 3, it is possible to prevent the etching from progressing to the electrode pad portion 2. Thus, it is possible to form easily the barrier metal layer 5 such that its circumferential end part 5b is located inward of the first opening 3a in the passivation layer 3 as seen in a plan view.

Lastly, by heating in a reflow furnace, the solder layer 16 is melted for a while so as to be formed into a spherical solder bump 6 as shown in FIG. 2. This forms the solder bump 6 (see FIG. 2) on the barrier metal layer 5. In this way, the electrode portion of the semiconductor chip 10 in the semiconductor device according to the first embodiment of the invention is formed.

Figure 13:
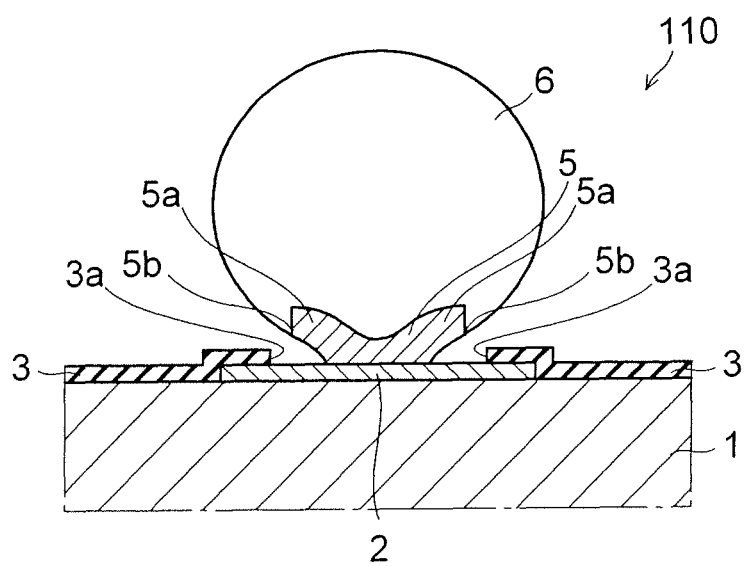
FIG. 13 A sectional view showing the structure of an electrode portion of the semiconductor chip according to a first modified example of the first embodiment.

Although the first embodiment described above deals with an example in which an insulating protection layer of polyimide is provided, this is not meant to limit the invention; it is instead possible to adopt a configuration provided with no insulating protection layer as in a semiconductor chip 110, shown in FIG. 13, according to a first modified example of the first embodiment. In this case, instead of an insulating protection layer of polyimide, a resist is used to form an electrode structure similar to that in the above-described embodiment, and thereafter the resist is removed to obtain a configuration with no insulating protection layer. Also in a case where the resist is removed by filling the gap between the semiconductor chip 110 and the printed circuit board with a resin member 40 as shown in FIG. 1, it is possible to suppress a lowering in the reliability of flip chip bonding.

Figure 14:
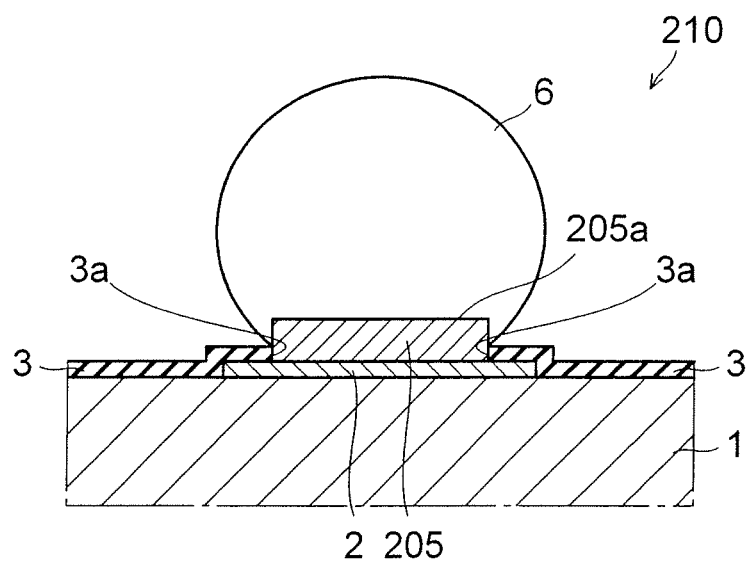
FIG. 14 A sectional view showing the structure of an electrode portion of the semiconductor chip according to a second modified example of the first embodiment.

Instead, as in a semiconductor chip 210, shown in FIG. 14, according to a second modified example of the first embodiment, it is also possible to form a barrier metal layer 205 over the entire surface of the region on the electrode pad portion 2 exposed through the first opening 3a in the passivation layer 3. In this case, by giving the barrier metal layer 205 a thickness greater than that of the passivation layer 3, it is possible to form the solder bump 6 such that it covers the circumferential end part 205a of the barrier metal layer 205.

Figure 15:
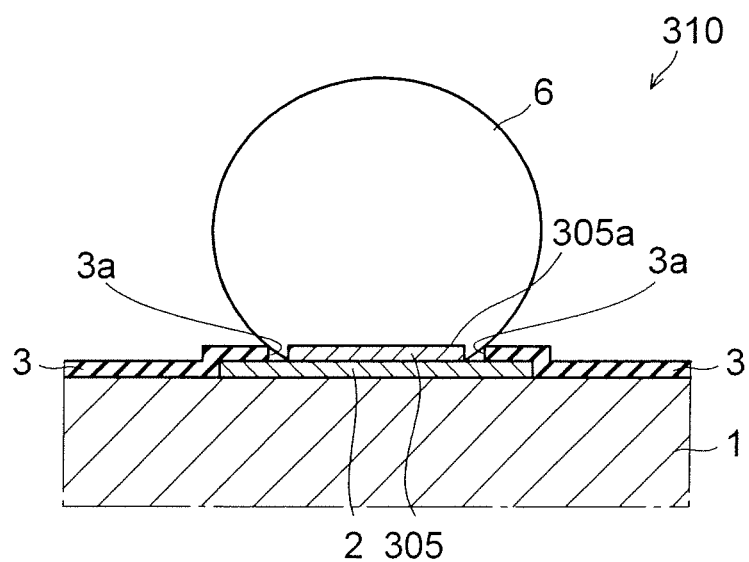
FIG. 15 A sectional view showing the structure of an electrode portion of the semiconductor chip according to a third modified example of the first embodiment.

Instead, as in a semiconductor chip 310, shown in FIG. 15, according to a third modified example of the invention, it is also possible to form the circumferential end part 305a of the barrier metal layer 305 in a region a predetermined distance away from the first opening 3a in the passivation layer 3.

Second Embodiment

Figure 16:
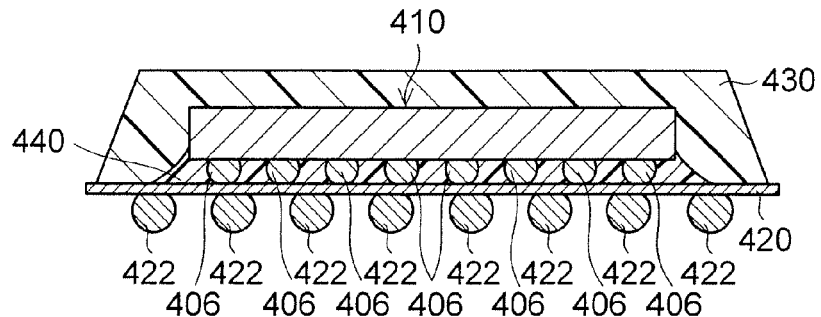
FIG. 16 A sectional view showing the structure of a semiconductor device according to a second embodiment of the invention.
Figure 17:
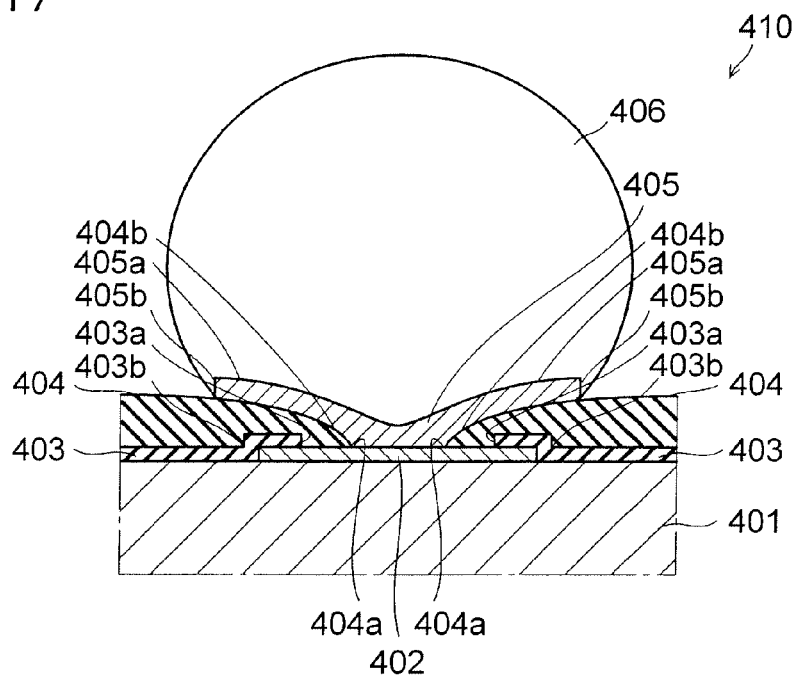
FIG. 17 A sectional view showing the structure of an electrode portion of the semiconductor chip in the semiconductor device shown in FIG. 16 according to the second embodiment of the invention.
Figure 18:
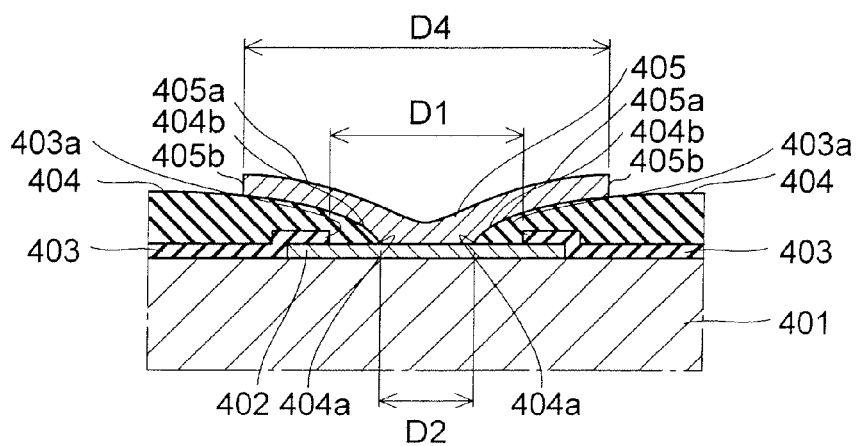
FIG. 18 A sectional view showing the structure of an electrode portion of the semiconductor chip, with a solder bump omitted, in the semiconductor device shown in FIG. 16 according to the second embodiment of the invention.
Figure 19:
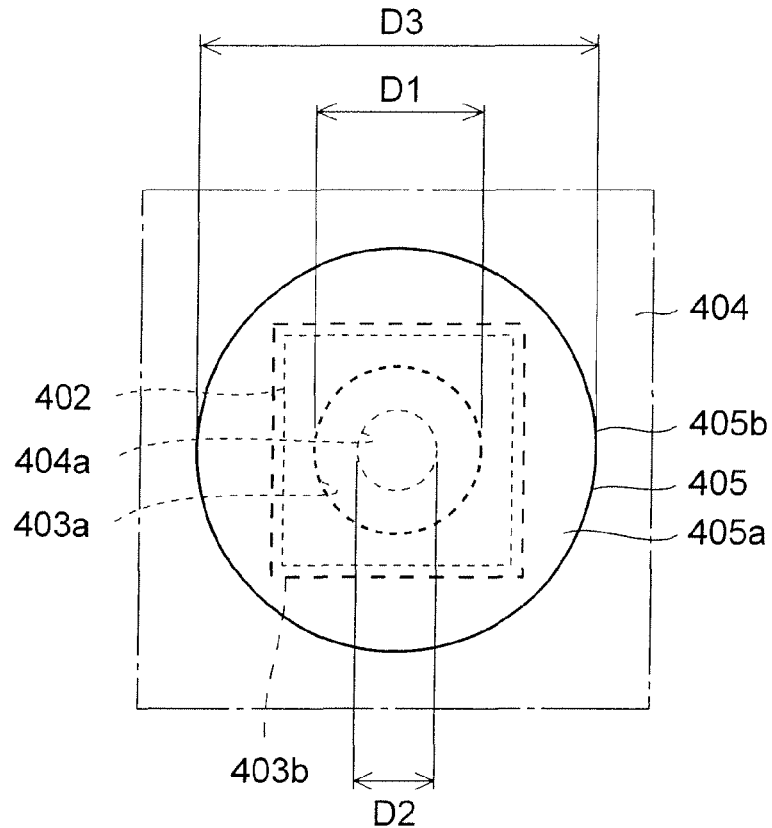
FIG. 19 A plan view showing the structure of an electrode portion of the semiconductor chip, with the solder bump omitted, in the semiconductor device shown in FIG. 16 according to the second embodiment of the invention.
Figure 20:
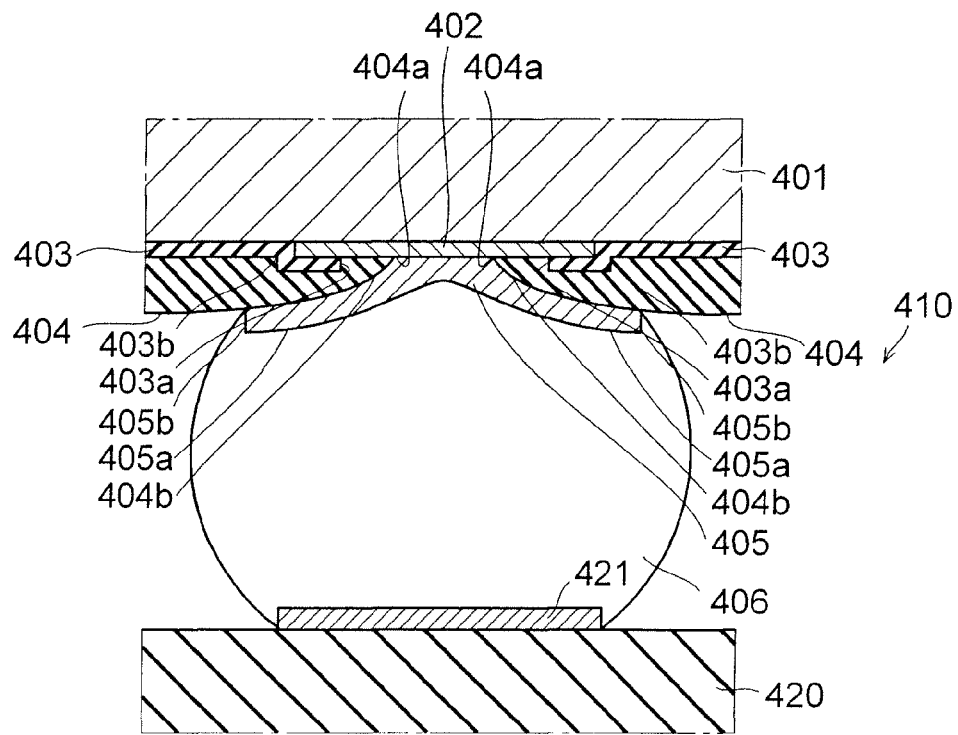
FIG. 20 A sectional view showing the semiconductor chip mounted on a printed circuit board.

FIG. 16 is a sectional view showing the structure of a semiconductor device according to a second embodiment of the invention. FIG. 17 is a sectional view showing the structure of an electrode portion of a semiconductor chip in the semiconductor device shown in FIG. 16 according to the second embodiment of the invention. FIGS. 18 to 20 are diagrams illustrating the structure of the semiconductor device according to the second embodiment of the invention. First, with reference to FIGS. 16 to 20, the structure of the semiconductor device according to the second embodiment of the invention will be described.

As shown in FIG. 16, the semiconductor device according to the second embodiment is provided with a semiconductor chip 410, a printed circuit board 420 on which the semiconductor chip 410 is mounted, and a resin sealing layer 430 that seals the semiconductor chip 410 in. The resin sealing layer 430 is formed of a thermosetting resin such as epoxy resin.

The semiconductor chip 410 comprises a semiconductor substrate 401 such as a silicon substrate, and on the top face of the semiconductor substrate 401, a circuit (unillustrated) such as an IC or LSI has been fabricated. It should be understood that the semiconductor substrate 401 is an example of a "substrate" according to the invention.

Moreover, as shown in FIGS. 17 and 18, on the top face of the semiconductor substrate 401, an electrode pad portion 402 of aluminum or an alloy of aluminum is formed. As shown in FIG. 19, the electrode pad portion 402 here is formed in a rectangular shape as seen in a plan view. Moreover, as shown in FIGS. 17 and 18, on the top face of the semiconductor substrate 401, a passivation layer 403 of silicon nitride is formed. In the passivation layer 403, a first opening 403a is formed through which a predetermined region of the electrode pad portion 402 is exposed. As shown in FIG. 19, the first opening 403a has a substantially circular shape as seen in a plan view, and is formed with an opening width D1 of about 85 μm to about 95 μm. Moreover, the passivation layer 403 is formed on the top face of the semiconductor substrate 401 so as to overlap a peripheral part of the electrode pad portion 402. Thus, the passivation layer 403 has a step part 403b formed in it. It should be understood that the passivation layer 403 is an example of a "first protection layer" according to the invention.

Over a predetermined region on the passivation layer 403 and a predetermined region on the electrode pad portion 402, an insulating protection layer 404 of polyimide is formed. As shown in FIGS. 18 and 19, in the insulating protection layer 404, a second opening 404a is provided that has an opening width D2 (about 55 μm to about 65 μm) smaller than the opening width D1 (about 85 μm to about 95 μm) of the first opening 403a in the passivation layer 403. As shown in FIG. 19, the second opening 404a has a substantially circular shape as seen in a plan view, and is formed to be substantially concentric with the first opening 403a. Moreover, a rim part 404b of the insulating protection layer 404 defining the second opening 404a is formed in an inclined shape. It should be understood that the insulating protection layer 404 is an example of a "second protection layer" according to the invention.

Moreover, as shown in FIGS. 17 and 18, on the electrode pad portion 402, a barrier metal layer 405 with a thickness of about 10 μm and of titanium (Ti) is formed, with a peripheral part 405a of the barrier metal layer 405 located in a region on the insulating protection layer 404 near the rim part 404b. That is, the barrier metal layer 405 is formed on the electrode pad portion 402 without making direct contact with the passivation layer 403. As shown in FIG. 19, the barrier metal layer 405 has a substantially circular shape as seen in a plan view, and is formed to be substantially concentric with the first opening 403a and with the second opening 404a.

Here, in the second embodiment, the barrier metal layer 405 is so formed that a circumferential end part 405b of the barrier metal layer 405 is located outward of the step part 403b of the passivation layer 403 as seen in a plan view. That is, the barrier metal layer 405 is formed with a width D4 (about 110 μm to about 120 μm) large enough to cover the step part 403b of the passivation layer 403.

Moreover, as shown in FIG. 17, on the barrier metal layer 405, a solder bump 406 with a height (thickness) of about 70 μm to about 100 μm and of a spherical shape is formed. The solder bump 406 is electrically connected, via the barrier metal layer 405, to the electrode pad portion 402. Moreover, the solder bump 406 is formed on the barrier metal layer 405 such that the solder bump 6 makes contact not only with the top face of the barrier metal layer 405 but also with the circumferential end part 405b of the barrier metal layer 405. That is, the solder bump 406 is bonded to the barrier metal layer 405 so as to cover the circumferential end part 405b of the barrier metal layer 405. This results in a larger bonding area than in a case where the solder bump 406 is bonded only to the top face, and thus contributes to increased bonding strength between the solder bump 406 and the barrier metal layer 405. It should be understood that the solder bump 406 is an example of a "bump electrode" according to the invention.

The printed circuit board 420 shown in FIG. 16 is formed of glass epoxy resin or the like, and has conductor layers (unillustrated) in a multiple-layer structure. On the top face of the printed circuit board 420, a plurality of connection pad portions 421 (see FIG. 20) are formed for electrical connection with solder bumps 406 on the semiconductor chip 410. On the bottom face of the printed circuit board 420, a plurality of electrode terminals 422 are formed that are electrically connected to the connection pad portions 421. The electrode terminals 422 are solder bumps 406 of a spherical shape, and are arrayed in a lattice-like pattern on the bottom face of the printed circuit board 420.

As shown in FIGS. 16 and 20, the semiconductor chip 410 having the solder bumps 406 formed on it is mounted face down on the printed circuit board 420. Specifically, as shown in FIG. 20, the semiconductor chip 410 is arranged with its top face (circuit face) facing the printed circuit board 420, and the solder bumps 406 on the semiconductor chip 410 are bonded to the connection pad portions 421 on the printed circuit board 420 by flip chip bonding. This electrically connects the solder bumps 406 and the connection pad portions 421 together.

As shown in FIG. 16, the gap between the semiconductor chip 410 and the printed circuit board 420 is filled with a resin member 440 of silicone resin, epoxy resin, acrylic resin, or the like.

In the second embodiment, as described above, the barrier metal layer 405 is formed on the electrode pad portion 402 so as not to make direct contact with the passivation layer 403. Thus, during the flip chip bonding of the semiconductor chip 410 (semiconductor substrate 401) onto the printed circuit board 420, even when a thermal stress ascribable to a difference in thermal expansion coefficient between the semiconductor chip 410 and the printed circuit board 420 acts on the solder bump 406, it is possible to suppress the thermal stress acting on the passivation layer 403, and thus it is possible to suppress development of a crack in the passivation layer 403. Thus, it is possible to suppress breakage of the passivation layer 403, and it is thereby possible to suppress a lowering in the reliability of the semiconductor device resulting from breakage of the passivation layer 403.

Moreover, in the second embodiment, the barrier metal layer 405 is so configured that its circumferential end part 405b is formed outward of the step part 403b as seen in a plan view, and this permits the barrier metal layer 405 to be configured such that the step part 403b is not located right under the circumferential end part 405b. Here, in the step part 403b of the passivation layer 403, because the passivation layer 403 is partly less thick and for other reasons, a crack is more likely to develop than in the other part of the passivation layer 403; on the other hand, however, thanks to the configuration described above, even when a thermal stress ascribable to a difference in thermal expansion coefficient between the semiconductor chip 410 (semiconductor substrate 401) and the printed circuit board 420 acts on the solder bump 406, it is possible to suppress development of a crack in the step part 403b of the passivation layer 403. This, too, contributes to suppressing a lowering in the reliability of the semiconductor device resulting from breakage of the passivation layer 403.

Moreover, in the second embodiment, the insulating protection layer 404 is formed over a predetermined region on the passivation layer 403 and a predetermined region on the electrode pad portion 402, and the barrier metal layer 405 is formed on the electrode pad portion 402 with the peripheral part 405a located over the insulating protection layer 404. Consequently, when the barrier metal layer 405 is formed on the electrode pad portion 402, it is possible to form easily the barrier metal layer 405 such that it does not make direct contact with the passivation layer 403 and that its circumferential end part 405b is located outward of the step part 403b as seen in a plan view.

Moreover, in the second embodiment, the rim part 404b of the insulating protection layer 404 defining the second opening 404a is formed in an inclined shape, and consequently even when the peripheral part 405a of the barrier metal layer 405 is formed over the insulating protection layer 404, it is possible to make the barrier metal layer 405 unlikely to break. Thus, it is possible to suppress a lowering in the reliability of the semiconductor device resulting from breakage of the passivation layer 403, and in addition it is possible to suppress a lowering in the reliability of the semiconductor device resulting from breakage of the barrier metal layer 405. It is thus possible to suppress more easily a lowering in the reliability of the semiconductor device.

FIGS. 21 to 27 are sectional views illustrating the process of forming an electrode portion of the semiconductor chip in the semiconductor device according to the second embodiment. Next, with reference to FIGS. 16 to 4 and 21 to 27, the process of forming an electrode portion of the semiconductor chip 410 will be described.

Figure 21:
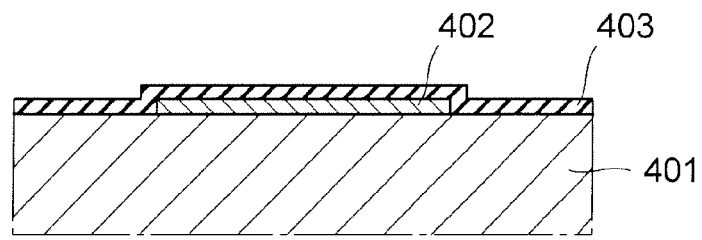
FIG. 21 A sectional view illustrating the process for forming an electrode portion of the semiconductor chip in the semiconductor device according to the second embodiment of the invention.
Figure 22:
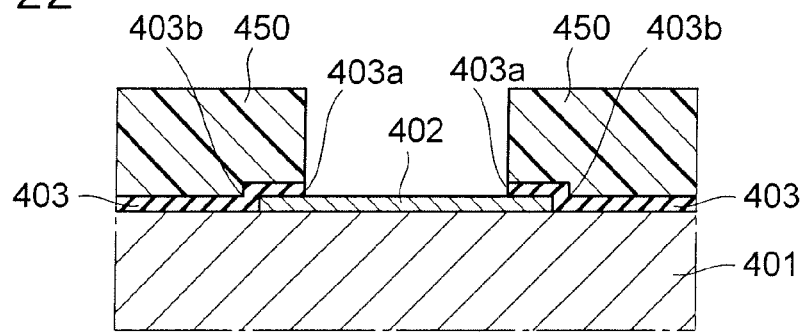
FIG. 22 A sectional view illustrating the process for forming an electrode portion of the semiconductor chip in the semiconductor device according to the second embodiment of the invention.

First, as shown in FIG. 21, over the entire surface of the top face of a semiconductor substrate 401 having an electrode pad portion 402 formed on it, a passivation layer 403 of silicon nitride is formed by plasma CVD or the like. Next, as shown in FIG. 22, a resist 450 is formed in a predetermined region on the passivation layer 403 by photolithography or the like. Then, with the resist 450 used as a mask, a predetermined region of the passivation layer 403 is removed by etching. This forms a first opening 403a in the passivation layer 403 through which a predetermined region on the electrode pad portion 402 is exposed. Here, the first opening 403a is formed with an opening width D1 (about 85 μm to about 95 μm, see FIGS. 18 and 19). The resist 450 is then removed.

Figure 23:
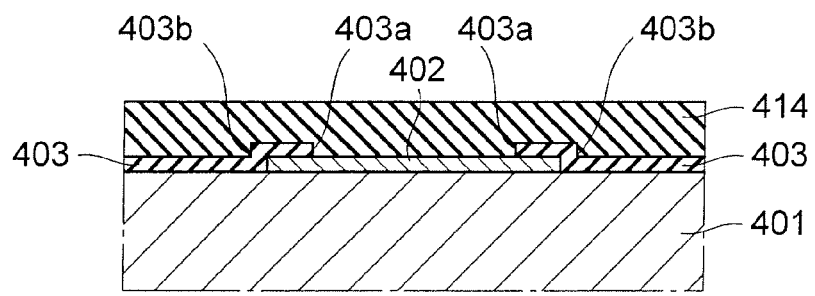
FIG. 23 A sectional view illustrating the process for forming an electrode portion of the semiconductor chip in the semiconductor device according to the second embodiment of the invention.
Figure 24:
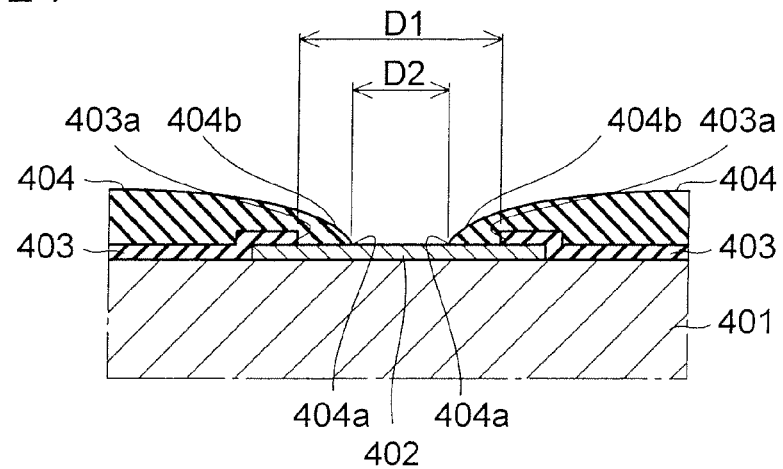
FIG. 24 A sectional view illustrating the process for forming an electrode portion of the semiconductor chip in the semiconductor device according to the second embodiment of the invention.

Subsequently, as shown in FIG. 23, over the entire surface, an insulating protection layer 414 of polyimide is formed by spin coating or the like. Then, a predetermined region of the insulating protection layer 414 is removed by photolithography and etching. Thereafter, the insulating protection layer 414 is flowed by heat processing. Thus, an insulating protection layer 404 as shown in FIG. 24 is obtained. Specifically, in the insulating protection layer 414 (see FIG. 23), a second opening 404a with an opening width D2 (about 55 μm to about 65 μm) smaller than the opening width D1 (about 85 μm to about 95 μm) of the first opening 403a in the passivation layer 403 is formed, and a rim part 404b defining the second opening 404a is formed in an inclined shape.

Figure 25:
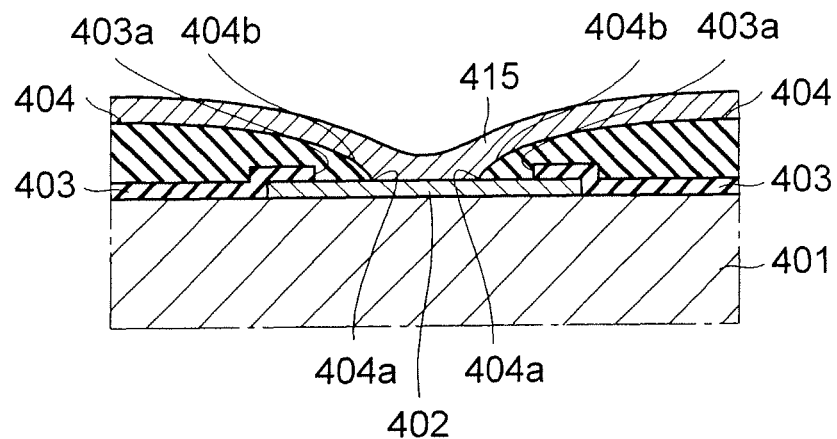
FIG. 25 A sectional view illustrating the process for forming an electrode portion of the semiconductor chip in the semiconductor device according to the second embodiment of the invention.
Figure 26:
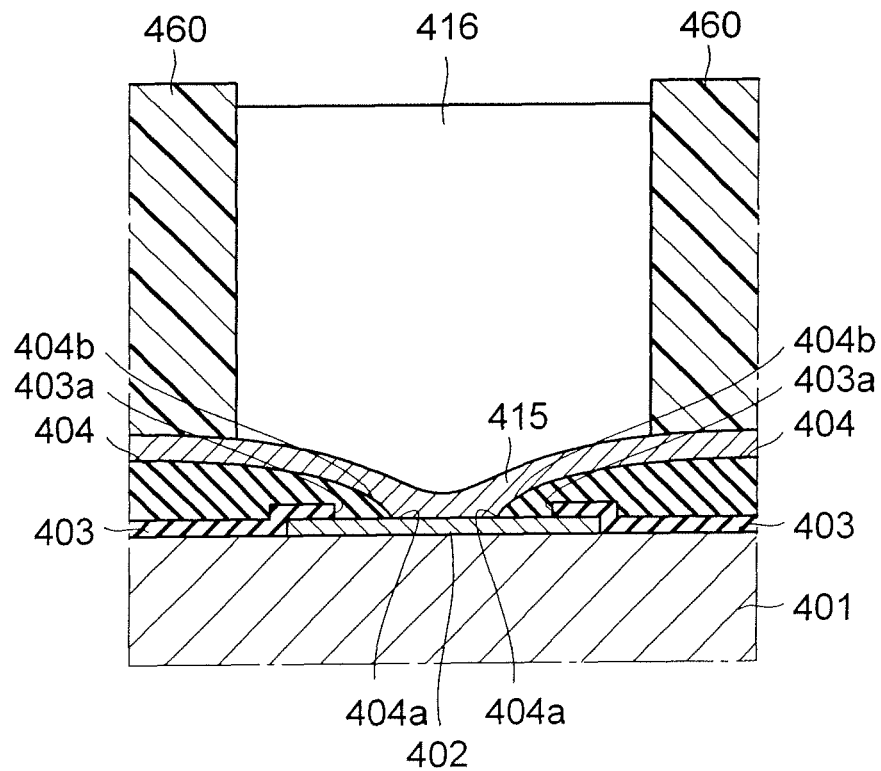
FIG. 26 A sectional view illustrating the process for forming an electrode portion of the semiconductor chip in the semiconductor device according to the second embodiment of the invention.

Next, as shown in FIG. 25, over the entire surface, a barrier metal layer 415 with a thickness of about 10 μm and of titanium (Ti) is formed by vapor deposition or the like. Next, as shown in FIG. 26, a resist 460 is formed in a predetermined region on the barrier metal layer 415 by photolithography and etching. Then, with the resist 460 used as a mask, a solder layer 416 is formed on the barrier metal layer 415 by plating or the like.

Figure 27:
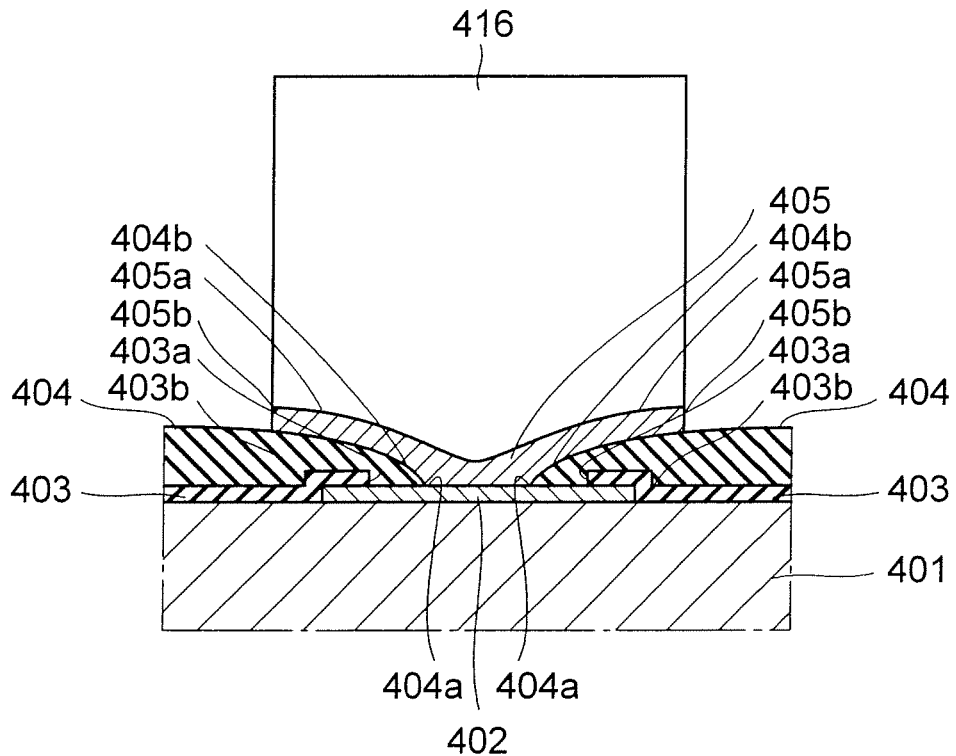
FIG. 27 A sectional view illustrating the process for forming an electrode portion of the semiconductor chip in the semiconductor device according to the second embodiment of the invention.

Thereafter, as shown in FIG. 27, the resist 460 (see FIG. 26) is removed, and the barrier metal layer 415 around the solder layer 416 is removed by etching. Thus, a barrier metal layer 405 of which a circumferential end part 405b is formed outward of the step part 403b of the passivation layer 403 as seen in a plan view as shown in FIG. 19 is formed on the electrode pad portion 402. Moreover, as shown in FIGS. 17 and 18, the barrier metal layer 405 formed on the electrode pad portion 402 is so configured that its peripheral part 405a is located over the insulating protection layer 404.

It should be noted that, as shown in FIG. 27, forming the insulating protection layer 404 described above permits the barrier metal layer 405 to be formed on the electrode pad portion 402 without making direct contact with the passivation layer 403.

Lastly, by heating in a reflow furnace, the solder layer 416 is melted for a while so as to be formed into a spherical solder bump 406 as shown in FIG. 17. This forms the solder bump 406 (see FIG. 17) on the barrier metal layer 405. In this way, the electrode portion of the semiconductor chip 410 in the semiconductor device according to the second embodiment of the invention is formed.

Figure 28:
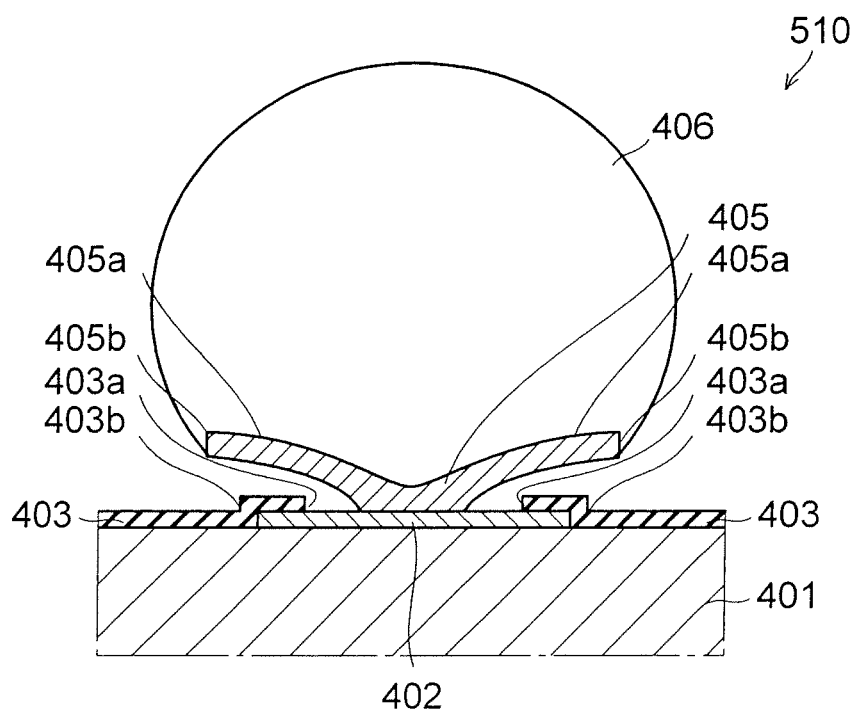
FIG. 28 A sectional view showing the structure of an electrode portion of the semiconductor chip according to a modified example of the second embodiment.
Figure 29:
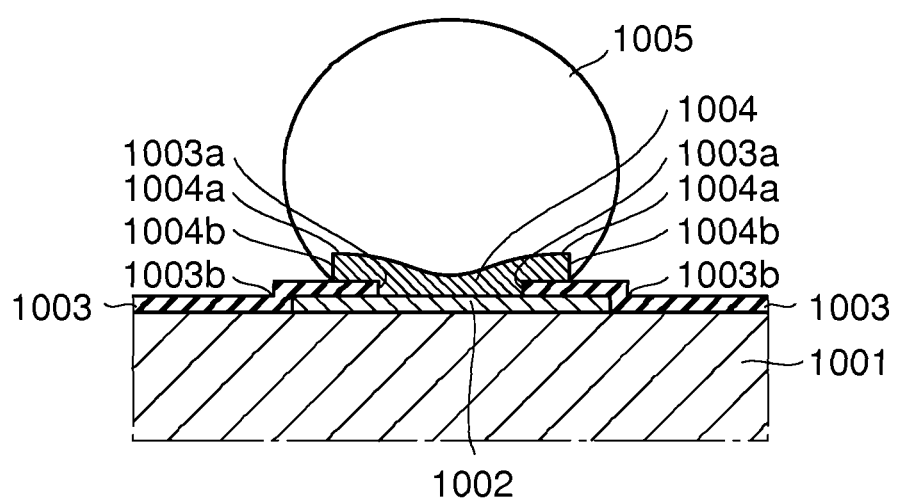
FIG. 29 A schematic sectional view showing the structure of a conventional semiconductor device disclosed in Patent Document 1.
Figure 30:
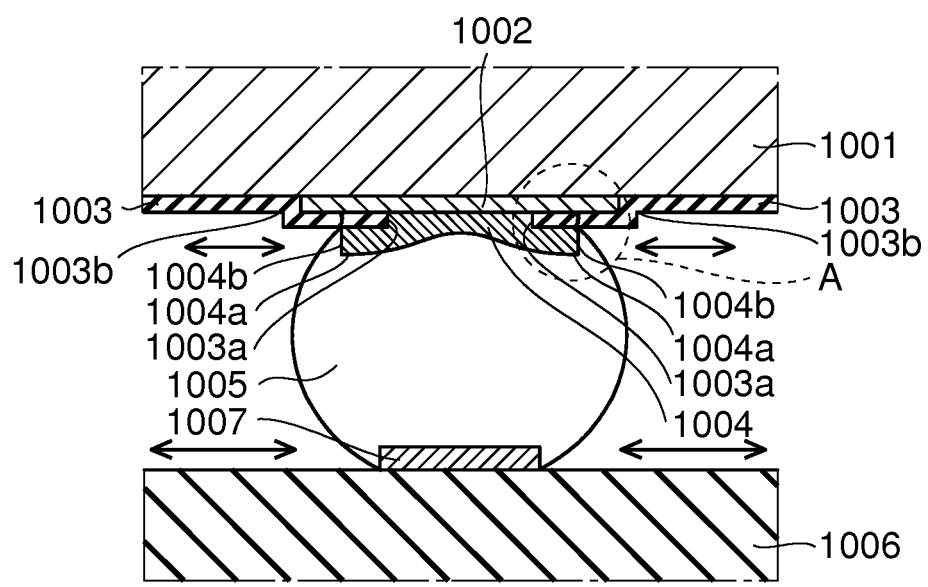
FIG. 30 A schematic sectional view showing the structure of a conventional semiconductor device disclosed in Patent Document 1.
Figure 31:
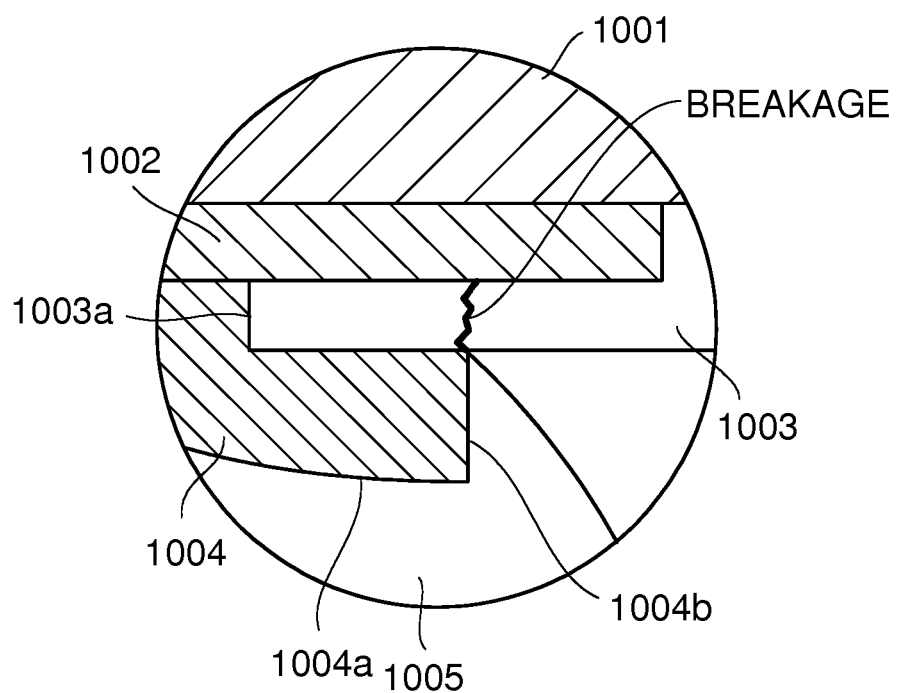
FIG. 31 An enlarged sectional view of part A in FIG. 30.

Although the second embodiment described above deals with an example in which an insulating protection layer of polyimide is provided, this is not meant to limit the invention; it is instead possible to adopt a configuration provided with no insulating protection layer as in a semiconductor chip 510, shown in FIG. 28, according to a modified example of the second embodiment. In this case, instead of an insulating protection layer of polyimide, a resist is used to form an electrode structure similar to that in the above-described embodiment, and thereafter the resist is removed to obtain a configuration with no insulating protection layer. Also in a case where the resist is removed by filling the gap between the semiconductor chip and the printed circuit board with a resin member 440 as shown in FIG. 16, it is possible to suppress a lowering in the reliability of flip chip bonding.

It should be understood that all the embodiments disclosed herein are in every aspect meant to be illustrative and not restrictive. The scope of the invention is defined not by the description of the embodiments presented above but by what is recited in the appended claims, and encompasses any modifications and variations made in a spirit and scope equivalent to those of the appended claims.

For example, although the first and second embodiments described above deal with examples in which the invention is applied to a semiconductor device with a EGA package, this is not meant to limit the invention; the invention may be applied to a semiconductor device other than with a BGA package.

For another example, although the first and second embodiments described above deal with examples in which an insulating protection layer is formed of polyimide, this is not meant to limit the invention; the insulating protection layer may be formed of any organic material other than polyimide, for example BCB (benzocyclobutene) or fluororesin.

For another example, although the first and second embodiments described above deal with examples in which a passivation layer is formed of silicon nitride, this is not meant to limit the invention; the passivation layer may be formed of any inorganic material other than silicon nitride. For example, the passivation layer may be formed of SiON, $SiO_2$, or the like.

For another example, although the first and second embodiments described above deal with examples in which an electrode pad portion is formed of aluminum or an alloy of aluminum, this is not meant to limit the invention; the electrode pad portion may be formed of any metal material other than aluminum or an alloy of aluminum, for example gold (Au) or an AlCu alloy.

For another example, although the first and second embodiments described above deal with examples in which a barrier metal layer is formed of titanium, this is not meant to limit the invention; the barrier metal layer may be formed of any material other than titanium. Materials other than titanium include, for example, TiN and Ta. The barrier metal layer may be given a multiple-layered structure having a plurality of metal layers stacked on one another For another example, although the first and second embodiments described above deal with examples in which a bump electrode comprising a solder bump is formed on the electrode pad, this is not meant to limit the invention; a bump electrode comprising a metal bump other than a solder bump (for example, an Au or Cu bump) may instead be formed on the electrode pad.

For another example, although the first and second embodiments described above deal with examples in which the gap between the semiconductor chip and the printed circuit board is filled with a resin member, this is not meant to limit the invention; the gap between the semiconductor chip and the printed circuit board may be left unfilled with a resin member.

The invention claimed is:

1. A semiconductor chip comprising:
    an electrode pad portion on a face of a substrate;
    a first protection layer disposed on the face of the substrate and overlapping a peripheral portion of the electrode pad portion establishing a first opening through which a first top face portion of the electrode pad portion is exposed, the first protection layer disposed on the face of the substrate and overlapping part of the electrode pad portion;
    an insulating protection layer covering a region on the first protection layer and a region on the electrode pad portion such that a second opening exposing a second top face portion of the electrode pad portion is formed, the second opening being within the first opening and the second top face portion being within the first top face portion of the electrode pad portion; and
    a barrier metal layer disposed on the second top face portion of the electrode pad portion, the barrier metal layer further comprising a peripheral part of the barrier metal layer formed over the insulating protection layer such that an electrode pad side facing surface of the peripheral part of the barrier metal layer comprises a curved surface having a center of curvature only on the electrode pad side of the barrier metal layer as seen in a sectional view.

2. The semiconductor chip of claim 1, wherein the barrier metal layer has a circumferential end part thereof formed inward of the first opening in the first protection layer as seen in a plan view.

3. The semiconductor chip of claim 1, wherein the barrier metal layer has a circumferential end part thereof formed outward of the first opening in the first protection layer as seen in a plan view.

4. The semiconductor chip of claim 1, further comprising a bump electrode bonded to the barrier metal layer so as to cover at least the top surface of the barrier metal layer.

5. The semiconductor chip of claim 1, wherein the insulating protection layer comprises polyimide.

6. A semiconductor device comprising the semiconductor chip of claim 1.

7. The semiconductor chip of claim 1, wherein a step part is formed where the first protection layer overlaps the peripheral portion of the electrode pad portion.

8. A semiconductor chip comprising:
    an electrode pad portion on a face of a substrate;
    a first protection layer disposed on the face of the substrate and overlapping a peripheral portion of the electrode pad portion establishing a first opening through which a first top face portion of the electrode pad portion is exposed, the first protection layer disposed on the face of the substrate and overlapping part of the electrode pad portion;
    an insulating protection layer covering a region on the first protection layer and a region on the electrode pad portion such that a second opening exposing a second top face portion of the electrode pad portion is formed, the second opening being within the first opening and the second top face portion being within the first top face portion of the electrode pad portion; and
    a barrier metal layer disposed on the second top face portion of the electrode pad portion;
    the barrier metal layer further comprising a peripheral part of the barrier metal layer formed over the insulating protection layer such that an electrode pad side facing surface of the peripheral part of the barrier metal layer comprises a continuously curving surface that abuts an inclined upper surface of the insulating protection layer such that the continuously curving surface and the inclined upper surface of the insulating protection layer both terminate at the first top face portion of the electrode pad portion as seen in a sectional view.

9. The semiconductor chip of claim 8, wherein the barrier metal layer has a circumferential end part thereof formed inward of the first opening in the first protection layer as seen in a plan view.

10. The semiconductor chip of claim 8, wherein the barrier metal layer has a circumferential end part thereof formed outward of the first opening in the first protection layer as seen in a plan view.

11. The semiconductor chip of claim 8, further comprising a bump electrode bonded to the barrier metal layer so as to cover at least the top surface of the barrier metal layer.

12. The semiconductor chip of claim 8, wherein the insulating protection layer comprises polyimide.

13. A semiconductor device comprising the semiconductor chip of claim 8.

14. The semiconductor chip of claim 8, wherein a step part is formed where the first protection layer overlaps the peripheral portion of the electrode pad portion.

15. A semiconductor device comprising:
    a semiconductor chip comprising:
        an electrode pad portion on a face of a substrate;
        a first protection layer disposed on the face of the substrate and overlapping a peripheral portion of the electrode pad portion establishing a first opening through which a first top face portion of the electrode pad portion is exposed, the first protection layer disposed on the face of the substrate and overlapping part of the electrode pad portion;
        an insulating protection layer covering a region on the first protection layer and a region on the electrode pad portion such that a second opening exposing a second top face portion of the electrode pad portion is formed, the second opening being within the first opening and the second top face portion being within the first top face portion of the electrode pad portion;
        a barrier metal layer disposed on the second top face portion of the electrode pad portion; the barrier metal layer further comprising a peripheral part of the barrier metal layer formed over the insulating protection layer such that an electrode pad side facing surface of the peripheral part of the barrier metal layer comprises a continuously curving surface that abuts an inclined upper surface of the insulating protection layer such that the continuously curving surface and the inclined upper surface of the insulating protection layer both terminate at the first top face portion of the electrode pad portion as seen in a sectional view; and
        a bump electrode bonded to the barrier metal layer so as to cover at least the top surface of the barrier metal layer;
    a printed circuit board having on a face thereof a connection pad portion connected to the bump electrode; and
    a resin sealing layer between the semiconductor chip and the printed circuit board.

16. The semiconductor device of claim 15, wherein the barrier metal layer has a circumferential end part thereof formed inward of the first opening in the first protection layer as seen in a plan view.

17. The semiconductor device of claim 15, wherein the barrier metal layer has a circumferential end part thereof formed outward of the first opening in the first protection layer as seen in a plan view.

18. The semiconductor device of claim 15, wherein the insulating protection layer comprises polyimide.

19. The semiconductor device of claim 15, wherein a step part is formed where the first protection layer overlaps the peripheral portion of the electrode pad portion.

20. A semiconductor chip comprising:
an electrode pad portion on a face of a substrate;
a first protection layer disposed on the face of the substrate and overlaps a peripheral portion of the electrode pad portion establishing a first opening through which a first top face portion of the electrode pad portion is exposed, the first protection layer disposed on the face of the substrate and overlapping part of the electrode pad portion, and wherein a step part is formed where the first protection layer overlaps the peripheral portion of the electrode pad portion;
an insulating protection layer covering a region on the first protection layer and a region on the electrode pad portion such that a second opening exposing a second top face portion of the electrode pad portion is formed, the second opening being within the first opening and the second top face portion being within the first top face portion of the electrode pad portion; and
a barrier metal layer disposed on the second top face portion of the electrode pad portion;
the barrier metal layer further comprising a peripheral part of the barrier metal layer formed over the insulating protection layer such that an electrode pad side facing surface of the peripheral part of the barrier metal layer comprises a continuously curving surface that abuts an inclined upper surface of the insulating protection layer such that the continuously curving surface and the inclined upper surface of the insulating protection layer both terminate at the first top face portion of the electrode pad portion as seen in a sectional view.

21. The semiconductor chip of claim 20, wherein the barrier metal layer has a circumferential end part thereof formed inward of the first opening in the first protection layer as seen in a plan view.

22. The semiconductor chip of claim 20, wherein the barrier metal layer has a circumferential end part thereof formed outward of the first opening in the first protection layer as seen in a plan view.

23. The semiconductor chip of claim 20, wherein the insulating protection layer comprises polyimide.

* * * * *